United States Patent [19]

Erkens

[11] Patent Number: 4,902,656

[45] Date of Patent: Feb. 20, 1990

[54] METHOD FOR MANUFACTURE OF OXIDE CERAMIC BODIES WITH A HIGH SURFACE AREA-TO-MASS RATIO AND HIGH STRENGTH

[76] Inventor: Herbert E. Erkens, An der Esche 8, 4050 Mönchengladbach 2, Fed. Rep. of Germany

[21] Appl. No.: 249,199

[22] Filed: Sep. 23, 1988

Related U.S. Application Data

[63] Continuation of Ser. No. 870,538, Jun. 4, 1986, abandoned.

[30] Foreign Application Priority Data

Jun. 4, 1985 [DE] Fed. Rep. of Germany ....... 3519932

[51] Int. Cl.$^4$ .............................................. C04B 35/10
[52] U.S. Cl. ..................................... 501/153; 156/667; 501/95; 501/108; 501/123; 501/127; 501/151
[58] Field of Search ............... 501/153, 104, 108, 123, 501/126, 127, 132, 133, 151, 95

[56] References Cited

U.S. PATENT DOCUMENTS

| | | | |
|---|---|---|---|
| 3,025,178 | 3/1962 | Seabright | 501/151 X |
| 3,658,597 | 4/1972 | Gray | 501/127 X |
| 3,950,478 | 4/1976 | Kenworthy et al. | 501/127 X |
| 4,252,408 | 2/1981 | Parsons et al. | 501/151 X |
| 4,483,935 | 11/1984 | Diller | 501/151 |
| 4,626,369 | 12/1986 | Walker | 501/151 X |

FOREIGN PATENT DOCUMENTS

| | | | |
|---|---|---|---|
| 56-09284 | 1/1981 | Japan | 501/127 |
| 223080 | 8/1968 | U.S.S.R. | 501/151 |

*Primary Examiner*—Mark L. Bell
*Attorney, Agent, or Firm*—Staas & Halsey

[57] ABSTRACT

The invention concerns a method for the manufacture of oxide ceramic bodies with a high ratio of surface area to mass and high strength.

These bodies manufactured by the method according to the invention are particularly suitable for forming composite materials, to increase the strength and refractoriness of components, for example and above all those of plastic and light metal components.

The method according to the invention consists of the solidification of eutectic, eutectoid or peritectic oxidehalide system, wherein the halides can subsequently be removed by dissolution and re-used. According to the system of raw materials, selected composition, temperature gradient and rate of solidification, plates firmly bonded together by twinning, separate plates or columnar oxide bodies can be produced, with particularly low wall thicknesses or diameters of, for example, approximately 0.1 to 0.2 $\mu$m. By combining the methods of "directional solidification" from the field of metallurgy with the method according to the invention, it is possible to manufacture oriented single crystals which are separate from each other, in the form of plates or fibers (whiskers) of any length.

7 Claims, No Drawings

METHOD FOR MANUFACTURE OF OXIDE CERAMIC BODIES WITH A HIGH SURFACE AREA-TO-MASS RATIO AND HIGH STRENGTH

This is a continuation of co-pending application Ser. No. 870,538 filed on June 4, 1986, now abandoned.

The invention concerns a method for the manufacture of oxide ceramic bodies which are monocrystalline and/or composed of individual crystals and bonded within themselves.

The fibers, single plates and lamellas manufactured by such a method, in this case have the special feature that in the longitudinal direction they consist of only a single crystal, i.e. material with constant crystallographic orientation. They therefore have high strength in this direction. Also, they have a high ratio of surface area to mass and, in the case of polycrystalline bodies, high strength of uniting the individual crystals with each other by twinning, so that they are chiefly suitable as a filler for reinforcing plastic components made of organic or inorgaic materials which are injection-molded, slip cast, pressed or prepared in one of the other known ways.

The possibility of reinforcing plastics by means of ceramic fillers is known. For instance, slate flour is frequently used to fill synthetic resins, in order thus to reproduce complicated shapes such as tools. The powders used for this are predominantly prepared by grinding coarse starting materials. In this case, angular grains of the most varied sizes are produced.

Another common method for the manufacture of particularly fine-grained modular ceramic powder consists of hydrolizing a water-soluble salt, and gradually driving off the water by heating.

For example, zirconium dioxide with particle sizes of up to 0.1 $\mu$m diameter can be made in this way from zirconium oxychloride.

Similar and other methods are known, by which very fine-grained material is obtained, e.g. for the preparation of coloring pigments. Furthermore, the practice of manufacturing $\alpha$-alumina fibers from an aluminum hydroxysulfate hydrate by firing, forms part of the state of the art according to Japanese patent JA 58 185 435 (Chemical Abstracts, Vol. 100, 1984, 88084x). The fibers are supposed to have diameters from 0.1 to 1 $\mu$m and length-to-diameter ratios of more than 20. However, it is known that these fibers always contain a small proportion of silicon dioxide, which is needed for manufacture as a binder and sintering agent, and moreover the fibers are composed of differently oriented crystals in the longitudinal direction. Accordingly, the tensile strength of these fibers is lower than that of, for example, carbon fibers by several orders of magnitude. The theoretical tensile strength of pure $\alpha$-alumina whiskers of diameter 1 $\mu$m is, for example, more than 10,000 N/mm$^2$.

Two plate-like single crystals are bonded together with particularly high strength when the bonding point consists of interpentration twins, which can be achieved only by simultaneous growth of the crystals. This can sometimes be observed, for example, when growing single crystals by the CVD (chemical vapor deposition) method. The drawback of the CVD method, by which columnar single crystals are produced predominantly, is however that it is very cost-intensive and therefore unsuitable for the preparation of larger quantities of ceramic fillers. Furthermore, in this process the powders or columnar crystallites are obtained by mechanical removal from a substrate, with the most varying appearance, i.e. with varying length-to-diameter ratio (=100), and are therefore little suited to the reinforcement of plastic components.

It is further known that whiskers can be made from carbides and borides as reinforcements for metal alloys by methods and processes of "directional solidification". For example, W. KURZ and P. R. SAHM, "Directionally Solidified Eutectic Material", Springer Verlag Berlin (1975), describe the methods which can be employed. The whiskers remain in the directionally solidified alloys. They can of course be etched out, but this is too cost-intensive for the preparation of large quantities. The whiskers have higher tensile strengths than the alloys used (predominantly nickel-based alloys).

Quite a large number of methods for the manufacture of polycrystalline fibers and whiskers are described in a study by the Commission of European Communities, P. BRACKE, "Inorganic fibers and composite materials" (EPO Applied Technology Series, No. 3), ISBN 0-08031145-8 (1984).

In these, mainly oxidic fibers and whiskers are obtained from their own melts at temperatures of more than 1300° C., or from melts of salts of hydroxy acids (e.g. sulfates) at lower temperatures. In the latter case, chemical reactions are carried out, e.g. hydrolysis with water vapor, acids or acid radicals being released at more than 600° C.

For example, in U.S. Pat. No.37 11 599 and U.S. Pat. No.38 75 296 is described a method in which a molten film which contains a nickel salt and at least one auxiliary salt from the series of alkali metal chlorides, bromides or sulfates, or calcium, barium or strontium chloride, is reacted with water vapor at 700° C. to 1200° C. In this way an acid or an acid radical, such as in this case hydrogen chloride or sulfur trioxide, is released. At the same time, in the supersaturated melt is produced nickel oxide which forms the fibers there.

This method has the disadvantage that inert gas shielding must be used on account of atmospheric humidity and the carbon dioxide present in air, otherwise hydrolysis would set in uncontrolled already at the stage of preparation of the melt and beforehand, and release the etching substances to the atmosphere. Hydrolysis also occurs during subsequent dissolution of the salts, so that the product is not obtained directly in pure form. The necessary confinement of the process and the need for recovery and concentration of the released substances to avoid damage to the environment, and also the strong corrosive effect of the released substances on the metallic materials, are the disadvantages of the method.

It is therefore the object of this invention to provide a method for the manufacture of bodies which consist of one or more extremely pure oxides, in which only salts which are chemically stable in air and with respect to solvents in all process conditions are used, but after solidification the salts can be separated from the product by means of a solvent and re-used.

The stated object is achieved by the fact that one or more oxidic materials which form a eutectic, eutectoid or peritectic phase system with one or more of the alkali metal-metal fluorides and/or alkaline earth metal-metal fluorides, are completely or partially fused therewith together with one or more of the alkaline earth metal halides and/or alkali metal halides in the form of chloride and/or bromide and/or iodide, the whole mixture is heated to not more that 1300° C. and then cooled with solidification, and further the halides are separated by means of a solvent.

It has now been found that a mixture of one or more oxides with one or more of the alkali metal fluorides or alkaline earth metal fluorides and also with one or more of the alkali metal halides of chlorine, bromine or iodine, fulfills the following boundary conditions for a method:

the mixture is chemically stable in air even in fusion, and with respect to water as a solvent;

the addition of the alkali metal halide has the effect that very fine fluoride particles, which have only very low solubility in water, are suspended by dissolving the alkali halide and can be separated together with the aqueous concentrated halide solution e.g. by means of filters of given pore size or centrifuges;

the aqueous halide solution together with the alkali metal-metal fluorides or alkaline earth metal-metal fluorides as suspended particles can be re-used directly, by evaporation;

the oxidic bodies are obtained in extremely pure form.

In experiments it has turned out that potassium and/or sodium fluoride is not suitable as the alkali metal halide additive, because these substances react with the oxide used in fusion. Thus, from a melt consisting of aluminum oxide, cryolite and sodium fluoride there are obtained only oxidic products which contain $\beta$-alumina, and therefore proportions of sodium oxide. This is avoided by using alkali metal and/or alkaline earth metal chlorides, bromides or iodides.

The use of one or more alkali metal-metal fluorides together with the oxide and one or more of the alkaline earth chlorides and/or bromides and/or iodides is also possible, because then the melt is also composed of the substances according to the invention, on account of the exchange of cations. They are reciprocal pairs of salts, in which the metal fluoride anion remains chemically stable, and no alkali metal fluoride or alkaline earth metal fluoride is formed.

According to the invention, only alkali metal-metal fluorides and/or alkaline earth metal-metal fluorides which form a eutectic, eutectoid or peritectic phase system with the oxide used, should be selected. Thus melts are obtained which still have high solubility of the oxide, in spite of the additional content of the alkali metal and/or alkaline earth metal chlorides, bromides and/or iodides, so that a high proportion of the melt is obtained as the product. Furthermore according to the invention it is possible to use the respective oxide in a higher concentration than corresponds to its solubility. Unfused oxide particles then act as a nucleus during subsequent solidification, so that particularly thin-walled plates grow on the nuclei.

A higher oxide concentration then corresponds to the solubility is selected in particular when starting from a highly porous oxide powder as the feedstock, whose pore diameter is to be increased, wherein the dissolved fraction grows on the porous particles mainly in the form of plates or fibers during solidification.

According to a further proposal of the invention, the method can be carried out in such a way that the mixture is prepared so that the cations of the melt consist, to the extent of more than 30% mol, of those of the alkali metals and/or alkaline earth metals, and the anions consist to the extent of more than 20% mol of those of the chlorine and/or bromine and/or iodine, and less than 80% mol but more than 5% mol of one or more anions of metal trifluorides, tetrafluorides, pentafluorides and/or hexafluorides.

It turned out that to obtain particularly high purity of the oxidic product, it is an advantage to use a high proportion of the alkali metal halide and/or alkaline earth metal halide, and a low proportion of the alkali metal-metal fluoride and/ or alkaline earth metal-metal fluoride. But then the proportion of oxide which can be dissolved in the melt is relatively low. This manner of proceeding is therefore particularly suitable for increasing the pore size of $\gamma$-alumina, producing spongelike $\alpha$-alumina with thin plates of $\alpha$-alumina grown thereon.

When high proportions of the alkali metal-metal fluoride or fluorides and/or alkaline earth metal-metal fluoride or fluorides are used, on the other hand, a high soluble oxide content in the melt of up to 40% by weight is obtained below 1300° C. In this case it is often necessary to treat the filtered product subsequently with e.g. strong concentrated acids such as sulfuric acid, in order to obtain high purity of the oxide.

According to a further proposal of the invention, the method can be carried out in such a way that essentially only the cations of sodium and/or potassium are used. Advantages arise here for reasons of cost, and on account of the high chemical stability.

According to a further proposal of the invention, the method can be carried out in such a way that potassium and/or sodium chloride is used in a weight ratio from 3/2 to 2/3 to the potassium-metal and/or sodium-metal trifluoride and/or tetrafluoride and/or pentafluoride and/or hexafluroide.

In the case of cryolite, sodium chloride and aluminum oxide, it has proved advantageous to use the two salts in a weight ratio of approximately 1:1. High purity of the oxidic product is obtained, and e.g. aluminum oxide can be used with up to approximately 40% by weight referred to the whole melt.

According to a further proposal of the invention, the method can be carried out in such a way that sodium aluminum hexafluoride (cryolite) and/or potassium aluminum hexafluoride is used. This results in a further reduction of costs.

According to a further proposal of the invention, the method can be carried out in such a way that aluminum oxide and/or silicon oxide and/or zirconium oxide and/or magnesium oxide and/or calcium oxide and/or titanium oxide and/or cadmium oxide and/or zinc oxide and/or chromium oxide and/or vanadium oxide and/or tungsten oxide and/or molybdenum oxide is or are used as the oxidic material.

The method is suitable for the manufacture of bodies from the most varied oxides. Firstly, it is possible to manufacture, from e.g. aluminum oxide and technically pure cryolite, bodies which are substantially purer than the oxide used. A large proportion of the impurities are found in the salt mixture and therefore not assimilated into the oxidic material during solidification. Secondly, several oxides can be dissolved simultaneously in the melt, and bodies consisting of oxide compounds can be obtained, as well.

By regulating the rate of solidification and the temperature gradient during solidification, the development of the oxidic bodies can be controlled.

According to a further proposal of the invention, the method can be carried out in such a way that the melt is quenched, and oxide ceramic mutually bonded plates, individual lamellas and/or fibers are obtained, whose thickness is predominantly less than 5μm, preferably 0.1 to 0.2 μm, and/or oxide ceramic bodies are obtained which comprise pores with diameters of predominantly up to 5 μm.

With rapid cooling, i.e. quenching, according to the type of salts and oxides used, very thin-walled bodies of less than 5 μm, with lengths of up to 30 μm, are obtained. When an aluminum oxide-containing melt consisting of cryolite with sodium chloride is quenched, for example, there are found bodies consisting of α-alumina which are composed of approximately 10 to 50 monocrystalline plates grown together at angles of 60° and 90°. The plates predominantly have dimensions of about 10–300 μm$^2$, with thicknesses of approximately 0.2 μm.

The preferred methods of cooling the melt rapidly consist of spraying in a room filled with cold gas, and quenching in a water bath or pouring the melt between two rotating cooled rollers whose surfaces are rough and which are spaced apart by approximately 1 mm.

Rapid cooling is also used preferably for the manufacture of porous oxide ceramic bodies, as has already been explained by the example of increasing the pore size of γ-alumina.

According to a further proposal of the invention, the method can be carried out in such a way that the melt is cooled with a ratio of temperature gradient to speed of solid-liquid interface of more than 50° C. h/cm$^2$, so that oxide ceramic lamellas and/or fibers and/or whiskers of any length are obtained, with wall thicknesses or diameters of mainly less than 10 μm, preferably less than 1 μm.

It was found that by applying the methods of "directional solidification" known from metallurgy, to the melts according to the invention, oxidic bodies are obtained which have any length but small thickness and which are composed of monocrystalline material in the longitudinal direction.

According to a further proposal of the invention, the method can be carried out in such a way that water or water-like solvent is used as the solvent. In particular, alcoholic and/or ammoniacal mixtures with water, liquid ammonia or liquid sulfur dioxide may be involved. In any case, the uses of cheap solvents is possible.

These bodies manufactured by the method according to the invention are particularly suitable for forming composite materials, to increase the strength and refractoriness of components, for example and above all those of plastic and light metal components.

The invention is explained below with reference to the practical examples.

1. 1 kg highly porous γ-alumina powder was ground together with 0.7 kg cryolite and 0.8 kg sodium chloride to an average grain size of about 20 μm. The mixture was heated to 1070° C. in a nickel crucible, and quenched in a water bath. During stirring a suspension was produced, which was filtered by means of a filter of pore diameter 8 μm while adding water and stirring further.

The filter cake was dried. It consisted of bodies of α-alumina with diameters from 10 to 30 μm, which were composed mainly of intergrown plates whose wall thicknesses were approximately 0.1 μm to 0.2 μm. A small proportion of the bodies consisted of powder grains with pores of about 1–3 μm diameter, onto which were frequently also grown plates and portions of plate bodies.

The aqueous solution obtained during filtering contained the cryolite in suspension with particle diameters of about 0.1 to 1 μm. The salts were recovered by evaporation. 2. A melt was produced from 3% by weight Al$_2$O$_3$, 64 % sodium chloride and 33 % by weight cryolite in austenitic tubes of 0.5 φmm. The tubes were lowered at 1100° C. without vibration from the hot part of the furnace into a water bath, so that the ratio of the temperature gradient to the rate of lowering was approximately 5000° C. h/cm$^2$. Thereafter the procedure was as in example 1. Oriented α-Al$_2$O$_3$ lamellas were obtained as the product, with widths of up to several hundred μm, lengths of several millimeters and thicknesses of approx. 1–5 μm.

3. The procedure was as in example 2, but a ratio of temperature gradient to rate of lowering of approx. 1500° C. h/cm$^2$ was set up. Oriented columnar crystallites were obtained with diameters of about 2 μm, ad individual narrow lamellas with thicknesses of about 2 μm consisting of α-alumina and several millimeters long.

4. The procedure was as in examples 2 and 3, but a ratio of 150° C. h/cm$^2$ was set up. The α-alumina product consisted of dendritic bodies with thicknesses of about 3–10 μm and a high proportion of unoriented columnar crystallites with diameters of about 0.2 to 1 μm and lengths of 20 to 50 μm.

I claim:

1. A method for the manufacture of monocrystalline oxide ceramic bodies comprising:
    forming a mixture of (1) an aluminumm oxide (2) a fluoride component consisting of one or more fluoride compounds selected from the group consisting of alkali metal-aluminum fluorides and alkaline earth metal-aluminum fluorides capable of forming a eutectic, eutectoid or peripectic phase system with said aluminum oxide, and (3) a halide component consisting of one or more halide compounds selected from the group consisting of alkaline earth metal chlorides, bromides and iodides and alkali metal chlorides, bromides and iodides;
    melting said mixture to fuse the same and heating the fused melt to not more than 1300° C.;
    cooling the fused mixture with uni-directional solidification; and
    removing halides from the cooled mixture by solvent extraction.

2. A method as set forth inn claim 1, wherein the mixture is formed in such a way that at least 30% of the cations thereof consist of either alkali metal ions or alkaline earth metal ions, at least 20% of the anions thereof consist of either chloride, bromide or iodide ions, and at least 5% but less than 80% of the anions thereof consist of either metal trifluoride, tetrafluoride, pentafluoride or haxafluoride ions.

3. A method as set forth in claim 2, wherein the melt is formed in such manner that essentially all of the cations of the melt are either sodium ions or potassium ions.

4. A method as set forth in claim 3, wherein the weight ratio of said halide component to said fluoride component in the melt ranges from 3:2 to 2:3.

5. A method as set forth in claim 1, 2, 3 or 4, wherein said fluoride component comprises one or more of sodium aluminum hexafluoride and potassium aluminum hexafluoride.

6. A method as set forth in claim 1, 2, 3 or 4, wherein the melt is cooled with a ratio of temperature gradient to speed of solid-liquid interface of more than 50° C. h/cm$^2$, so that oxide ceramic lamellas and/or fibers and/or whiskers of any length are obtained, with wall thicknesses or diameters of mainly less than 10μm.

7. A method as set forth in claim 1, 2, 3 or 4, wherein water or an aqueous medium is used as the solvent.

* * * * *